United States Patent
Spuller et al.

(10) Patent No.: US 7,851,385 B2
(45) Date of Patent: *Dec. 14, 2010

(54) LOW TEMPERATURE CONFORMAL OXIDE FORMATION AND APPLICATIONS

(75) Inventors: Matthew Spuller, San Francisco, CA (US); Melody Agustin, Santa Clara, CA (US); Meiyee (Maggie Le) Shek, Palo Alto, CA (US); Li-Qun Xia, Cupertino, CA (US); Reza Arghavani, Scotts Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 12/241,826

(22) Filed: Sep. 30, 2008

(65) Prior Publication Data
US 2009/0087977 A1   Apr. 2, 2009

Related U.S. Application Data

(60) Provisional application No. 60/976,576, filed on Oct. 1, 2007.

(51) Int. Cl.
*H01L 21/31* (2006.01)
*H01L 21/469* (2006.01)
*C23C 16/40* (2006.01)
*C23C 16/00* (2006.01)

(52) U.S. Cl. .............. 438/788; 438/787; 438/789; 438/790; 257/E21.278; 257/E21.279; 427/255.28; 427/255.37; 427/255.29; 427/569

(58) Field of Classification Search ............ 427/255.28, 427/255.37, 569, 255.29; 438/787, 789, 438/788, 790; 257/E21.278, E21.279
See application file for complete search history.

(56) References Cited

U.S. PATENT DOCUMENTS

| 4,892,753 | A | 1/1990 | Wang et al. |
| 5,151,028 | A | 9/1992 | Snead |
| 6,232,166 | B1 | 5/2001 | Ju et al. |
| 6,329,717 | B1* | 12/2001 | Jang et al. ............ 257/750 |
| 6,653,189 | B1 | 11/2003 | Haddad et al. |
| 6,949,796 | B1 | 9/2005 | Ellis-Monaghan et al. |
| 7,253,123 | B2 | 8/2007 | Arghavani et al. |
| 2001/0049183 | A1* | 12/2001 | Henson et al. ........ 438/479 |
| 2003/0161951 | A1 | 8/2003 | Yuan et al. |
| 2005/0118837 | A1* | 6/2005 | Todd et al. .......... 438/791 |

(Continued)

OTHER PUBLICATIONS

PCT International Search Report and Written Opinion dated Dec. 16, 2008 for International Application No. PCT/US2008/78162. (APPM/012186 PCT P).

*Primary Examiner*—Ha Tran T Nguyen
*Assistant Examiner*—Aaron A Dehne
(74) *Attorney, Agent, or Firm*—Patterson & Sheridan, LLP

(57) ABSTRACT

The present invention generally provides apparatus and method for processing a semiconductor substrate. Particularly, embodiments of the present invention relate to a method and apparatus for forming semiconductor devices having a conformal silicon oxide layer formed at low temperature. One embodiment of the present invention provides a method for forming a semiconductor gate structure. The method comprises forming a gate stack on a semiconductor substrate, forming a conformal silicon oxide layer on the semiconductor substrate using a low temperature cyclic method, and forming a spacer layer on the conformal silicon oxide layer.

19 Claims, 11 Drawing Sheets

U.S. PATENT DOCUMENTS

| | | |
|---|---|---|
| 2005/0167732 A1* | 8/2005 | Iguchi et al. ................. 257/315 |
| 2005/0233522 A1 | 10/2005 | Iguchi et al. |
| 2005/0233524 A1* | 10/2005 | Lee ............................ 438/264 |
| 2006/0154493 A1* | 7/2006 | Arghavani et al. .......... 438/786 |
| 2007/0042544 A1 | 2/2007 | Wu et al. |
| 2007/0126046 A1 | 6/2007 | Takeuchi |
| 2007/0166919 A1 | 7/2007 | Iguchi et al. |
| 2007/0232071 A1 | 10/2007 | Balseanu et al. |
| 2007/0232082 A1 | 10/2007 | Balseanu et al. |
| 2008/0083944 A1* | 4/2008 | Buh et al. ................... 257/319 |

* cited by examiner (A-A)

(B-B)

(A-A)

(B-B)

(A-A)

(B-B)

LOW TEMPERATURE CONFORMAL OXIDE FORMATION AND APPLICATIONS

CROSS-REFERENCE TO RELATED APPLICATIONS

This application claims benefit of U.S. provisional patent application Ser. No. 60/976,576, filed Oct. 1, 2007, which is herein incorporated by reference.

BACKGROUND OF THE INVENTION

1. Field of the Invention

Embodiments of the present invention generally relate to a method and apparatus for semiconductor processing. More particularly, embodiments of the present invention relate to a method and apparatus for forming semiconductor devices having a conformal oxide layer.

2. Description of the Related Art

Forming dielectric layers on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques.

CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Dielectric layers that are used for applications such as barrier layers and spacers are typically deposited over features, e.g., horizontal interconnects for subsequently formed lines, vertical interconnects (vias), gate stacks, etc., in a patterned substrate. Preferably, the deposition provides a conformal layer. However, it is often difficult to achieve conformal deposition.

For example, it is difficult to deposit a barrier layer over a feature with few or no resulting surface defects or feature deformation. During deposition, the barrier layer material may overloaf, that is, deposit excess material on the shoulders of a via and deposit too little material in the base of the via, forming a shape that looks like the side of a loaf of bread. The phenomena is also known as footing because the base of the via has a profile that looks like a foot. In extreme cases, the shoulders of a via may merge to form a joined, sealed surface across the top of the via. The film thickness non-uniformity across the wafer can negatively impact the drive current improvement from one device to another. Modulating the process parameters alone does not significantly improve the step coverage and pattern loading problems.

Deposition of conformal layers over gate stacks to provide layers that are subsequently etched to form spacers is also challenging. While methods of depositing silicon nitride and silicon oxide layers for spacers using high temperature, low pressure conventional CVD have been developed, the thermal budget for such techniques is becoming too high as semiconductor device geometry continues to shrink. Additionally, undesired effects, such as channel oxidation, may occur due to the high temperature during formation of dielectric materials. PECVD processes of silicon nitride and silicon oxide deposition can be performed at lower temperatures, but the step coverage and pattern loading results are not as desirable as those obtained with high temperature, low pressure CVD.

Therefore, a need exists for method of depositing conformal films over formed features in a patterned substrate at low temperatures.

SUMMARY OF THE INVENTION

The present invention generally provides apparatus and method for processing a semiconductor substrate. Particularly, embodiments of the present invention relate to a method and apparatus for forming semiconductor devices having a conformal silicon oxide layer formed at low temperature.

One embodiment of the present invention provides a method for forming a semiconductor gate structure. The method comprises forming a gate stack on a semiconductor substrate, forming a conformal silicon oxide layer on the semiconductor substrate using a low temperature cyclic method, and forming a spacer layer on the conformal silicon oxide layer.

Another embodiment of the present invention provides a method for forming a memory cell. The method comprises forming a memory gate stack comprising a floating gate and control gate on a semiconductor substrate, and forming a gate sidewall spacer on the semiconductor substrate using a low temperature cyclic method.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and method for forming a silicon oxide layer using plasma enhanced chemical vapor deposition (PECVD) by means of cyclic deposition at a low temperature. The silicon oxide layer of the present invention is formed at a low temperature, thus, avoiding undesired oxidation to a substrate. The silicon oxide layer of the present invention has excellent conformality and reduces pattern loading effect (PLE) due to the cyclic deposition used. The silicon oxide film of the present invention other desired properties in semiconductor processing, such as high breakdown, low leakage, and low wet etching rate.

Embodiments of the present invention further comprise applications of such silicon oxide layer in semiconductor devices. In one embodiment, the silicon oxide layer according to present invention may be used to prevent oxidation to silicon during process, for example the silicon oxide may be used as spacers in gate structures to prevent oxidation of silicon channel and provide improve device control. In another embodiment, the silicon layer may be used in controllable void formation, for example, the silicon oxide with controlled voids may be used to replace thermal oxide films in a flash memory cell, thus enabling further scaling with low cost.

Deposition of Conformal Oxide Layer

The present invention provides apparatus and methods for forming a silicon oxide layer at low temperatures. A PECVD chamber may be used to form the silicon oxide layer. Exemplary chamber that may be used for the processes described herein include the PRODUCER® P3 chamber, PRODUCER® APF™ PECVD chamber, PRODUCER® BLACK DIAMOND® PECVD chamber, PRODUCER® BLOK® PECVD chamber, PRODUCER® DARC PECVD chamber, PRODUCER HARP chamber, PRODUCER® PECVD chamber, PRODUCER SACVD chamber, PRODUCER® SE STRESS NITRIDE PECVD chamber, and PRODUCER® TEOS FSG PECVD chamber, each of which are commercially available from Applied Materials, Inc. of Santa Clara, Calif. The chambers may be configured individually, but are most likely part of an integrated tool. The processes may be performed on any substrate, such as a 200 mm or 300 mm substrate or other medium suitable for semiconductor or flat panel display processing. The processing conditions described below are provided with respect to a PRODUCER® SE STRESS NITRIDE PECVD chamber, which has two isolated processing regions. Thus, the flow rates experienced per each substrate processing region are half of the flow rates into the chamber.

Figure 1A:
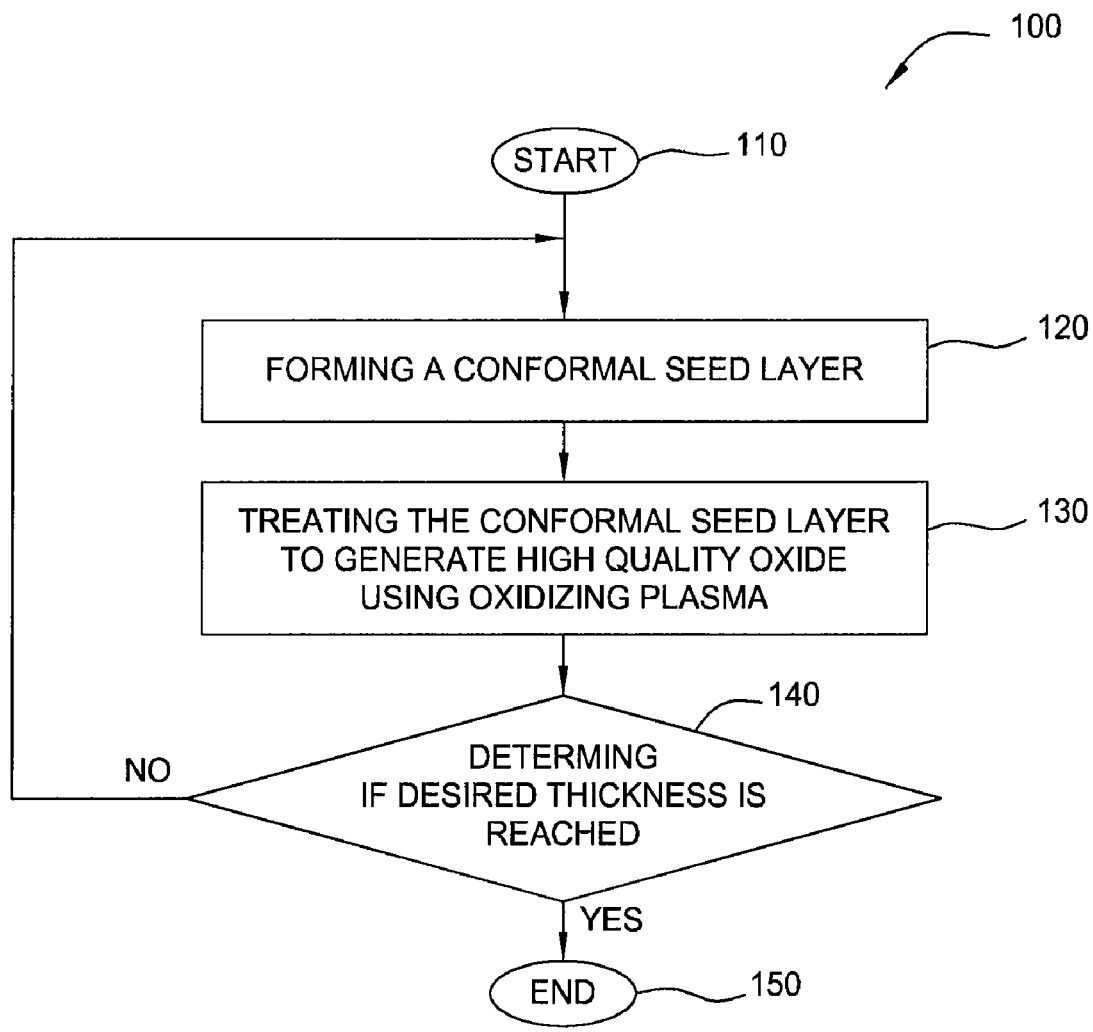
FIG. 1A illustrates a flow chart for forming a silicon oxide layer in accordance with one embodiment of the present invention.

FIG. 1A illustrates a flow chart of a deposition process 100 for forming a silicon oxide layer in accordance with one embodiment of the present invention. All of the process steps of deposition process 100 may be performed in the same chamber.

The process 100 begins with start step 110 that includes placing a substrate with at least one formed feature across its surface, i.e., a patterned substrate, into a chamber. The formed feature may be any type of formed feature such as a via, interconnect, or gate stack, for example.

Figure 2A:
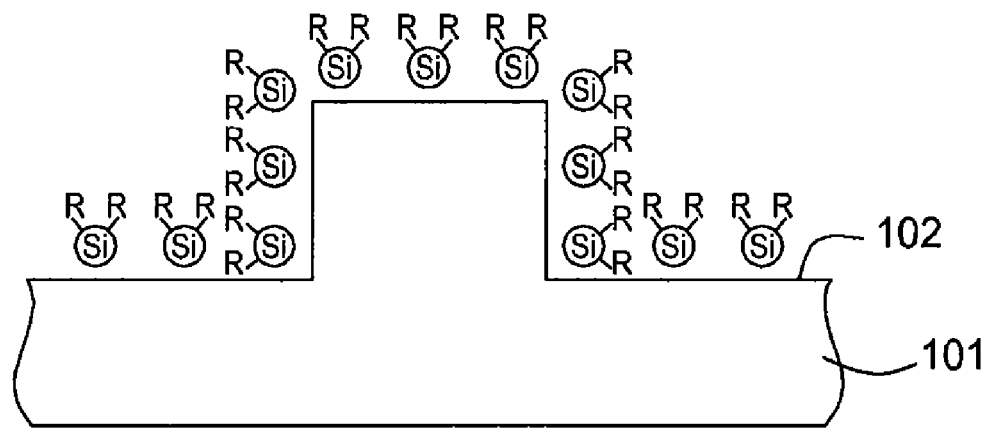
FIGS. 2A-2B are schematic diagrams of the deposition of a layer of silicon oxide according to one embodiment of the present invention.

The deposition process further comprises depositing of a conformal seed layer by exposing the substrate to a silicon-containing precursor simultaneously with plasma present in the chamber, as show in step 120. FIG. 2A schematically illustrates a silicon containing seed layer uniformly deposited on a top surface 102 of a feature 101.

The silicon-containing precursor can include octamethylcyclotetrasiloxane (OMCTS), methyldiethoxysilane (MDEOS), bis(tertiary-butylamino)silane (BTBAS), tridimethylaminosilane (TriDMAS), silane, disilane, dichlorosilane, trichlorosilane, dibromosilane, silicon tetrachloride, silicon tetrabromide, or combinations thereof. In one aspect, OMCTS and silane are preferred silicon-containing precursors. The plasma is provided at about 50 W to about 3000 W of RF power at a frequency of 13.56 MHz and/or 350 KHz. Gases that are optionally introduced into the chamber at the same time as the silicon-containing precursor include carrier gases, such as helium, nitrogen, oxygen, nitrous oxide, and argon. Oxygen and/or helium are the preferred additional gases for introduction to the chamber if an additional gas is used.

In step 120, the silicon-containing precursor may be introduced into the chamber at a flow rate of between about 5 sccm and about 1000 sccm. An optional carrier gas, e.g., helium, may be introduced into the chamber at a flow rate of between about 100 sccm and about 20000 sccm. The ratio of the flow rate of the silicon-containing precursor, e.g., octamethylcyclotetrasiloxane, to the flow rate of the carrier gas, e.g., helium, into the chamber is about 1:1 or greater, such as between about 1:1 and about 1:100. The chamber pressure may be greater than about 5 mTorr, such as between about 1.8 Torr and about 10 Torr, and the temperature of a substrate support in the chamber may be between about 125° C. and about 580° C. while the silicon-containing precursor is flowed into the chamber to deposit the layer. More particularly, the temperature is between about 200° C. and about 400° C. The silicon-containing precursor may be flowed into the chamber for a period of time sufficient to deposit a layer having a thickness of between about 5 Å and about 2000 Å. For example, the silicon-containing precursor may be flowed into the chamber for between about 0.1 seconds and about 120 seconds.

In one embodiment, the plasma during step 120 may be provided by RF power at between about 50 W and about 3000 W at a frequency of 13.56 MHz or 350 KHz. The RF power may be provided to a showerhead, i.e., a gas distribution assembly, and/or a substrate support of the chamber. The spacing between the showerhead and the substrate support is greater than about 230 mils, such as between about 350 mils and about 800 mils.

Figure 2B:
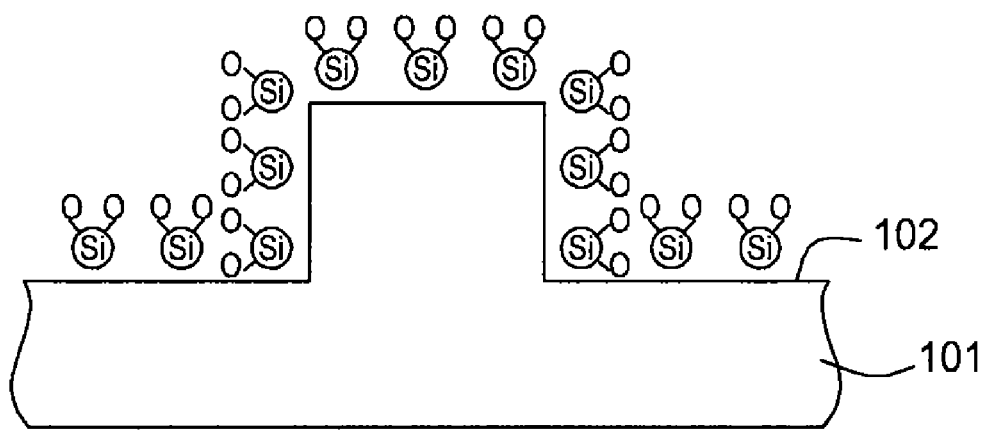

Following step 120, an oxygen plasma treatment is performed to the deposited seed layer to generating a layer of silicon oxide in step 130. FIG. 2B schematically illustrates the silicon containing seed layer uniformly deposited on the top surface 102 of the feature 101 is oxidized and a layer of silicon oxide is formed.

In step 130, an oxygen-containing gas, such as oxygen or nitrous oxide, is introduced into the chamber. The oxygen-containing gas may be introduced into the chamber at a flow rate of between about 100 and about 20000 sccm. The oxygen-containing gas may be flown into the chamber for a period of time such as between about 0.1 seconds and about 120 seconds. The oxygen plasma may be provided by applying a RF power of between about 50 W and about 3000 W in the chamber at a frequency of 13.56 MHz and/or 350 KHz. The chamber pressure may be between about 5 mTorr and about 10 Torr, and the temperature of a substrate support in the chamber may be between about 125° C. and about 580° C. while the oxygen-containing gas is flowed into the chamber.

The oxygen plasma treatment may be terminated by interrupting the RF power and the flow of the oxygen-containing gas into the chamber. Subsequently, the thickness of the deposited dielectric layer is then analyzed or estimated during thickness determination step 140.

If the thickness of the deposited layer or layers is equal to or greater than a given desired thickness, the process 100 is completed during end step 150. During end step 150, the substrate undergoes additional processing and is removed from the chamber.

If the thickness is not equal to or greater than a given desired thickness, then the deposition step 120, the plasma treatment step 130 and the thickness determination step 140 may be repeated multiple times until the desired film thickness is obtained, for example, about 1 to about 6 repetitions may be performed. In one embodiment, a silicon oxide of thickness of about 4 Å may be deposited per cycle.

If the thickness is not equal to or greater than a given desired thickness, the flow of the silicon-containing precursor into the chamber is then resumed to deposit an additional amount of the dielectric layer. The chamber is purged and then an oxygen plasma treatment as described above is performed. Multiple cycles of deposition, purging, and plasma treatment may be performed until the desired thickness of dielectric layer is obtained.

Figure 1B:
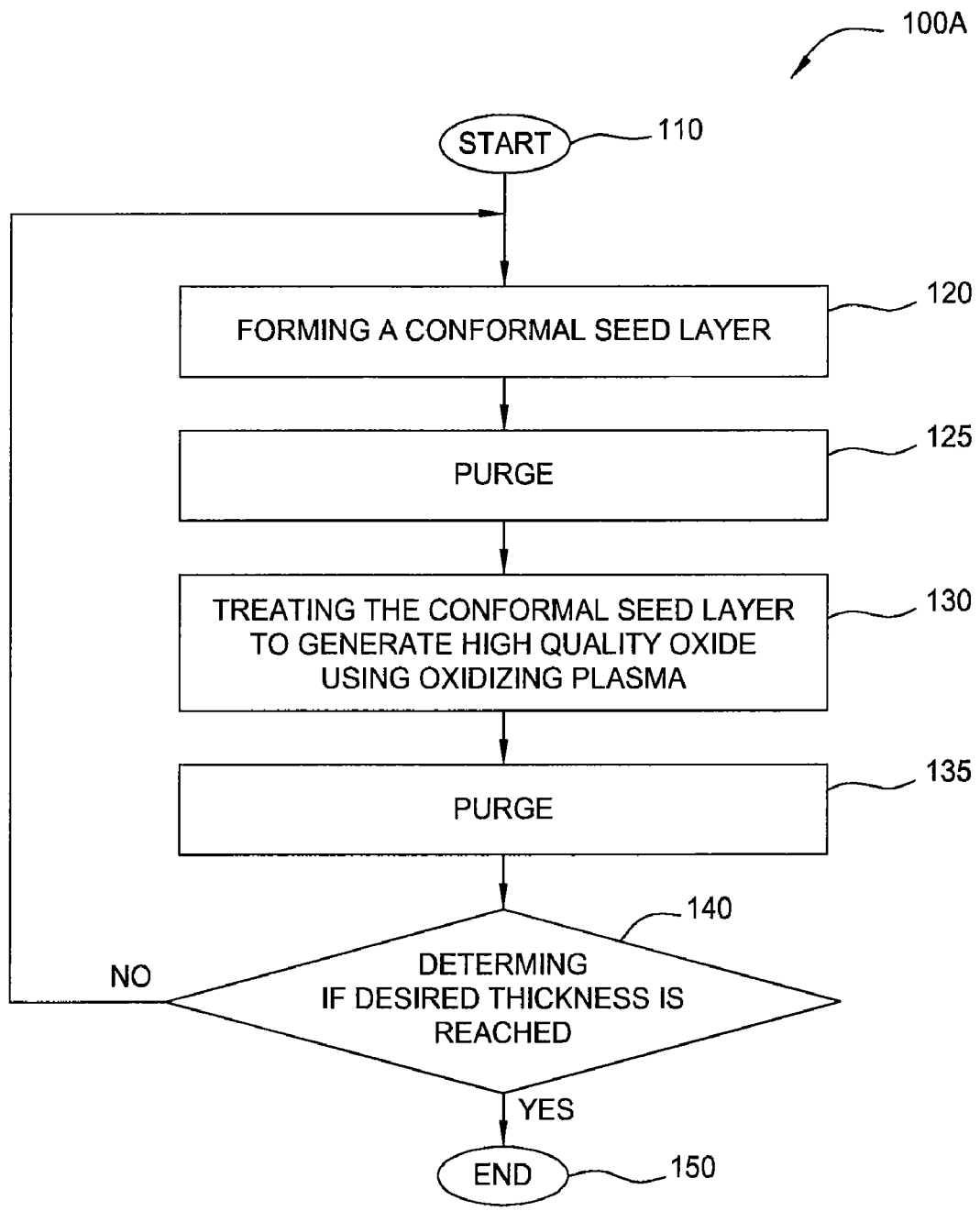
FIG. 1B illustrates a flow chart for forming a silicon oxide layer in accordance with another embodiment of the present invention.

FIG. 1B illustrates a flow chart of a deposition process 100a for forming a silicon oxide layer in accordance with another embodiment of the present invention. The deposition process 100a is similar to the deposition process 100 except the deposition process 100a comprises a purge step after step 120.

The deposition process 100a starts with steps 110 and 120 as described in FIG. 1A. A purge step 125 follows the formation of conformal seed layer. In step 125, the flow of the silicon-containing precursor into the chamber and the RF power are then stopped, and any remaining silicon-containing precursor is purged from the chamber by introducing an oxygen-containing gas, such as oxygen gas, nitrous oxide, or a combination thereof into the chamber in step 630. The oxygen-containing gas may be introduced into the chamber at a flow rate of between about 100 and about 20000 sccm. The oxygen-containing gas may be flowed into the chamber for a period of time such as between about 0.1 seconds and about 60 seconds. The chamber pressure may be between about 5 mTorr and about 10 Torr, and the temperature of a substrate support in the chamber may be between about 125° C. and about 580° C. while the oxygen-containing gas is flowed into the chamber.

Detailed description of similar deposition processes may be found in U.S. patent application Ser. No. 11/693,005, now U.S. Publication 2007/0232071, published on Oct. 4, 2007, and U.S. Pat. No. 7,789,865, issued on Aug. 24, 2010), entitled "Method to Improve the Step Coverage and Pattern Loading for Dielectric Films", and U.S. patent application Ser. No. 11/668,911, now U.S. Publication 2007/0232082, published on Oct. 4, 2007, and U.S. Pat. No. 7,601,651, issued on Oct. 13, 2010), entitled "Method to Improve the Step coverage and Pattern Loading for Dielectric Films", which are incorporated herein by reference.

Advantage 1: Conformal

In one aspect, the embodiment described with respect to FIG. 1 is a pulsed layer deposition (PLD), as pulses of the silicon-containing precursor separated by oxygen plasma treatments provide sequentially deposited thin layers that form a complete layer. Silicon oxide films formed by cyclic deposition described above are high quality conformal films.

It is noted that deposition rates approximately 10-fold higher than deposition rates for atomic layer deposition (ALD) processes have been obtained using processes according to embodiments of the invention. Furthermore, it is noted that the processes described herein can be performed in conventional chemical vapor deposition chambers, such as PRODUCER PECVD™ chambers.

It has been found that using the RF power levels, spacing, pressure, and flow rate ratios described above, a thin, uniform dielectric layer having a thickness of only between about 3 Å and about 25 Å can be reliably deposited when a self-saturating precursor is used as a precursor to deposit the layer. A 1 Å thickness range of the layer within a single 300 mm substrate has been obtained using the conditions provided herein. As defined herein, a "self-saturating precursor" is a precursor that deposits one thin layer, e.g., one molecular layer of the precursor, on a substrate. The presence of the thin dielectric layer hinders the further deposition of additional layers of the dielectric material from the precursor under the processing conditions used to deposit the thin layer. OMCTS is a preferred self-saturating precursor as it contains a large number of methyl groups that result in a self-saturating deposition of layer. In other words, a conformal first layer may be deposited from OMCTS because as soon as the surface of the underlying substrate is covered with OMCTS molecules, the presence of the Si—$CH_3$ bonds at the surface of the deposited layer substantially hinders further deposition until some of the methyl groups are removed by the oxygen plasma treatment described above. Thus, the deposition of each molecular layer of OMCTS can be well controlled, which enhances the step coverage of the final layer.

The deposition of an oxide layer deposited according to an embodiment of the invention was measured on the side, bottom, and top of features in patterned substrates having regions with a high density of features (dense areas) and low density of features (isolated areas). A sidewall/top coverage of 75% was achieved in dense areas, and a sidewall/top coverage of 80% was achieved in isolated areas. A bottom/top coverage of 85% was achieved in dense areas, and a bottom/top coverage of 95% was achieved in isolated areas. 0% pattern loading effect (PLE) was observed for the top of features, and only 10% PLE was observed was for the sidewall and bottom of features. In one example, an oxide layer was deposited to a top thickness of 420 Å in a feature having an aspect ratio of 3.5. The thickness of the layer on the sidewall was 275 Å, and the thickness on the bottom was 345 Å. Thus, the sidewall/top step coverage was 66%, the bottom/top step coverage was 83%, and the sidewall/bottom step coverage was 80%. In another example, a low dielectric constant carbon-doped oxide film was deposited to a top thickness of 340 Å in a feature having an aspect ratio of 3.5. The thickness of the layer on the sidewall was 125 Å, and the thickness on the bottom was 210 Å. Thus, the sidewall/top step coverage was 35%, the bottom/top step coverage was 60%, and the sidewall/bottom step coverage was 58%.

While the embodiments and results above have been discussed primarily with respect to using OMCTS as the silicon-containing precursor to deposit silicon oxide or carbon-doped silicon oxide films, other silicon-containing precursors may be used. Other silicon-containing precursors that include a Si—O or Si—N backbone and one or more alkyl groups attached to the silicon atoms may also be used. Additionally, other plasma treatments may be used to form other films.

Advantage 2: Avoiding Undesired Oxidation

Figure 3:
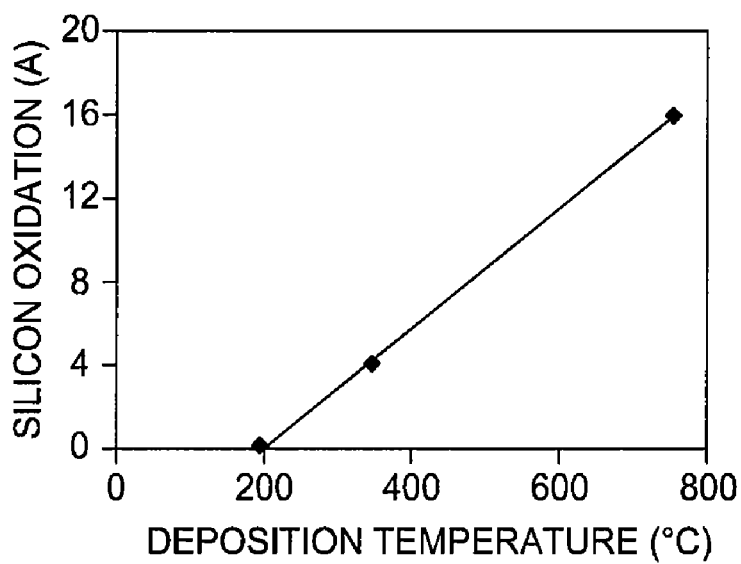
FIG. 3 illustrates a relationship of temperature and thickness of oxidation in a silicon substrate from a hafnia/silicon oxidation test.

Silicon in a substrate stack is susceptible to oxidation from oxidizing species in nearby structure when exposed to high temperature. FIG. 3 illustrates a relationship of temperature and thickness of oxidation in a silicon substrate from a hafnia/silicon oxidation test. The test substrates have a layer of hafnia (HfO$_2$) deposited directly on silicon. The silicon substrates are then disposed in environments of different temperatures for the same duration. As shown in FIG. 3, the silicon is almost not oxidized when the temperature is lower than 200° C. and thickness of oxidation is approximately linear to the temperature when exposed to environment above 200° C.

Thus, the low temperature silicon oxide of the present invention reduces undesired oxidation in nearby structures.

Advantage 3: Excellent Electrical Properties

Figure 4:
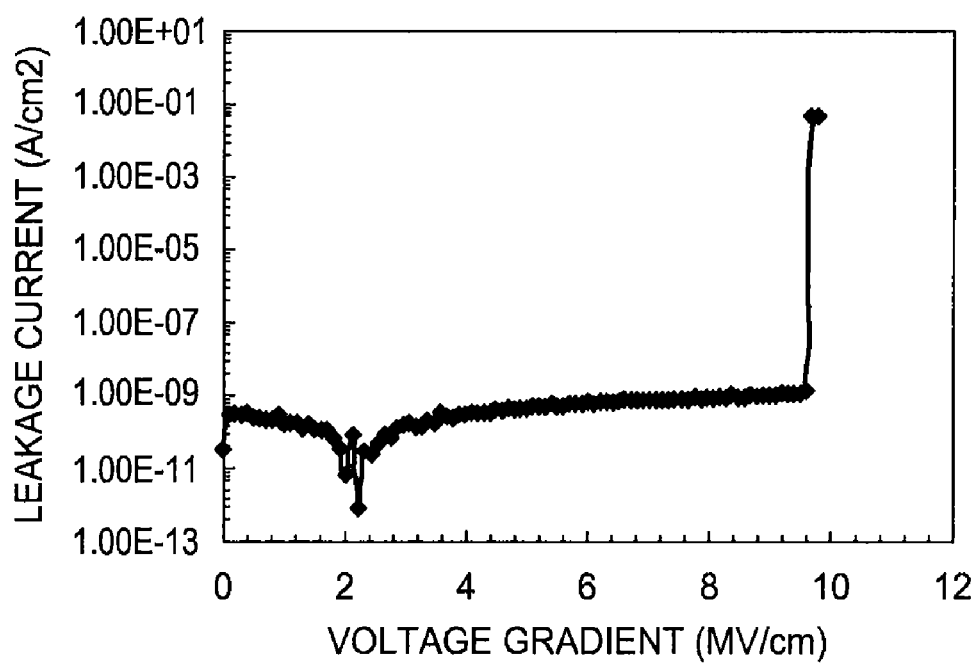
FIG. 4 illustrates dielectric breakdown of a silicon oxide layer formed according to one embodiment of the present invention.

FIG. 4 illustrates dielectric breakdown of a silicon dioxide formed according to one embodiment of the present invention. The breakdown voltage gradient of the silicon dioxide is about 10 mV/cm.

Spacer Oxide in Gate Stack

FIGS. 5A-5D illustrate formation of a gate structure according to one embodiment of the invention.

Figure 5A:
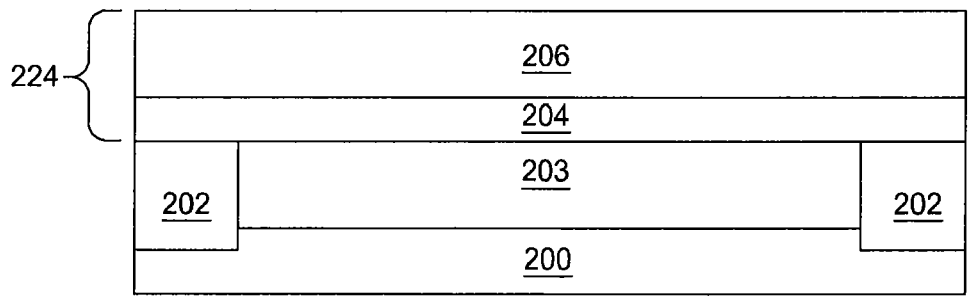
FIGS. 5A-5D schematically illustrate formation of a gate structure having a low temperature spacer oxide in accordance with one embodiment of the present invention.

Referring to FIG. 5A, a plurality of field isolation regions 202 are formed in a substrate 200 (e.g., a silicon wafer). The plurality of field isolation regions 202 isolate a well 203 of one type conductivity (e.g., p-type) from adjacent wells (not shown) of other type conductivity (e.g., n-type). Then, a gate dielectric layer 204 is formed on the substrate 200 and on isolation regions 202. Typically, gate dielectric layer 204 may be formed by depositing or growing a layer of a material such as silicon oxide (SiO$_n$) and/or silicon oxynitride, which form layers having a dielectric constant less than about 5.0. Recent advances in gate dielectric technology indicate that higher dielectric constant materials (K>10) are desirable for forming gate dielectric layer 204.

Examples of suitable materials to be employed therefor include, but are not limited to, metal oxides (Al$_2$O$_3$, ZrO$_2$, HfO$_2$, TiO$_2$, Y$_2$O$_3$, and La$_2$O$_3$), ferroelectics (lead zirconate titanate (PZT) and barium strontium titanate (BST)), amorphous metal silicates (HfSi$_x$O$_y$ and ZrSi$_x$O$_y$), amorphous silicate oxides (HfO$_2$, and ZrO$_2$), and paralectrics (Ba$_x$Sr$_{1-x}$TiO$_3$ and PbZr$_x$Ti$_{1-x}$O$_3$). High k layers containing these materials may be formed by various deposition processes.

Further, an electrically conductive gate electrode layer 206 is blanket deposited over gate dielectric layer 204. Generally, the gate electrode layer 206 may comprise a material such as, but not limited to, doped polysilicon, undoped polysilicon, silicon carbide, or silicon-germanium compounds. However, contemplated embodiments may encompass a gate electrode layer 206 containing a metal, metal alloy, metal oxide, single crystalline silicon, amorphous silicon, silicide, or other material well known in the art for forming gate electrodes.

Figure 5B:
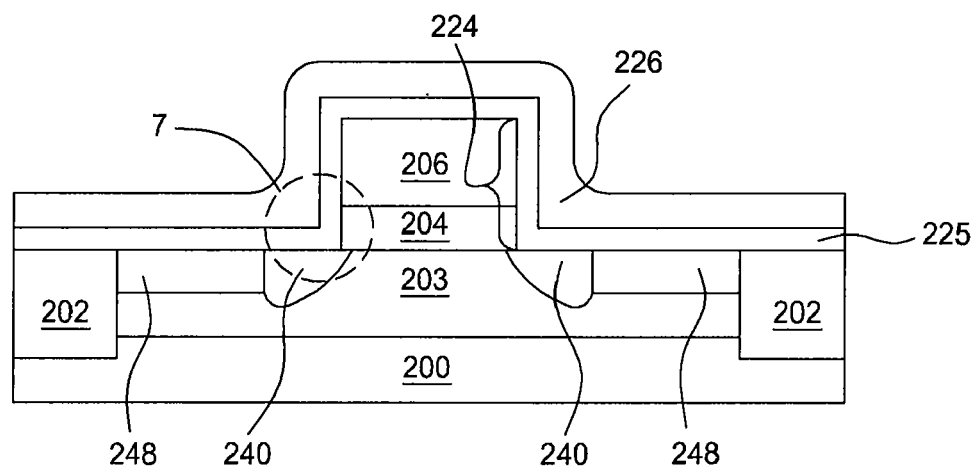

Referring to FIG. 5B, a hard-mask layer (not shown), such as a nitride layer, is deposited via a CVD process over electrically conductive gate electrode layer 206. A photolithography process is then carried out including the steps of masking, exposing, and developing a photoresist layer to form a photoresist mask (not shown). The pattern of the photoresist mask is transferred to the hard-mask layer by etching the hard-mask layer to the top of the gate electrode layer 206, using the photoresist mask to align the etch, thus producing a hard-mask (not shown) over the gate electrode layer 206.

The structure is further modified by removing the photoresist mask and etching the gate electrode layer 206 down to the top of the dielectric layer 204, using the hard-mask to align the etch, thus creating a conductive structure including the remaining material of gate electrode layer 206 underneath the hard-mask. This structure results from etching the gate electrode layer 106, but not the hard-mask or gate dielectric layer 204. Continuing the processing sequence, the gate dielectric layer 204 is etched to the top of the substrate 200 and to the tops of the isolation regions 202. The gate electrode 206 and the gate dielectric 204 together define a composite structure 224, sometimes known as a gate stack, or gate, of an integrated device, such as a transistor.

In further processing of the transistor, halo regions 240 are formed by utilizing a tilt angle implanting. The gate electrode 206 protects the substrate region beneath the gate dielectric 204 from being implanted with ions. A rapid thermal process (RTP) anneal may then be performed to drive the halo regions 240 partially underneath the gate dielectric 204.

Next, the substrate 200 is subjected to a light dosed source/drain (LDD) implant process to form lightly doped source/drain regions 248 in the well region 203. The light implant includes implanting ions with the same conductivity type impurities used to form the halo regions 240. At the same time, if the electrically conductive gate electrode comprises polysilicon, the deep implant process can be used to dope the polysilicon in the gate electrode 206 if not previously doped. An activation anneal may be performed to activate the halo regions 240 and lightly doped source/drain regions 248.

Next, a conformal thin oxide layer 225 is deposited over the entire substrate surface. This oxide layer is used to protect the silicon surface from the spacer layer, which is a silicon nitride layer for conventional process. The conformal thin oxide layer 225 relaxes the stress between silicon substrate and nitride spacer and it also protect the gate corners from the silicon nitride spacer. If low k and non-silicon-nitride material is used as sidewall spacer, this conformal thin oxide layer 225 can possibly be eliminated or be replaced by other low k material. In one embodiment, the conformal thin oxide layer 225 may be formed using low temperature cyclic method shown FIG. 1A or FIG. 1B.

Afterwards, in one embodiment of the invention, a spacer layer 226, with thickness in the range between about 200 Å to about 1000 Å, preferably between about 400 Å to about 800 Å, is blanket deposited over the top of the gate stack 224 and along the entire length of the sides of the gate stack 224, including the entire length of the sidewalls of the gate electrode 206 and the gate dielectric 204. At the same time, the spacer layer 226 is deposited on top of any exposed portion of the substrate 200 or isolation regions 202. Therefore, it is desirable to have a spacer layer deposition process with lower deposition temperature. Plasma Enhanced Chemical Vapor Deposition (PECVD) process typically has lower deposition temperature. For a silicon nitride layer deposited by a plasma process, the deposition temperature can be lowered to 450° C. or less.

Figure 5C:
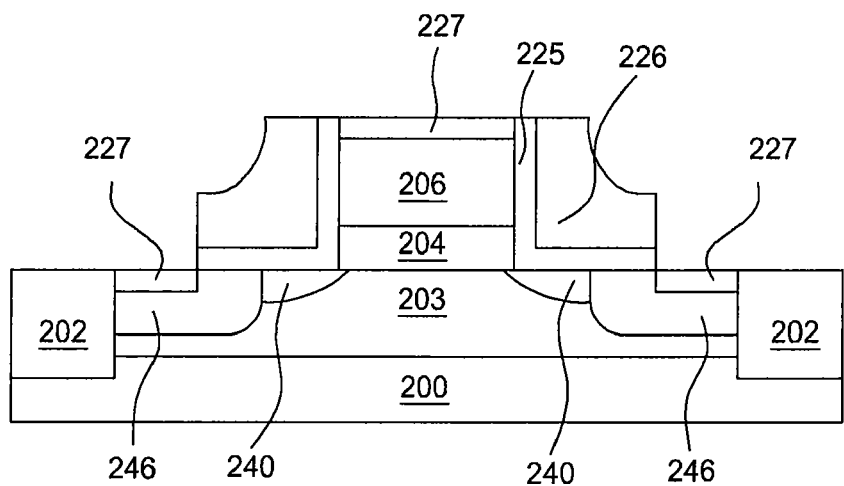

As shown in FIG. 5C, the spacer layer 226 and thin oxide layer 225 are then etched to remove the spacer layer 226 and thin oxide layer 225 from the top of the gate electrode 206 as well as from the top surface of the isolation regions 202 and from most of the top surface of the substrate 200 except immediately to either side of the gate stack 224. The anisotropic etch, however, leaves a portion of the spacer layer 226 and thin oxide layer 225 along the entire length of the sidewalls of both the gate electrode 206 and the gate dielectric 204, thus forming a sidewall spacer 226. Alternatively, the sidewall spacers 226 may be deposited as a single layer or as two or more sequentially deposited layers. The substrate 200 is subjected to a deep, high dose source/drain (HDD) implant process to form deep junction source/drain regions 246 in the well region 203.

Figure 5D:
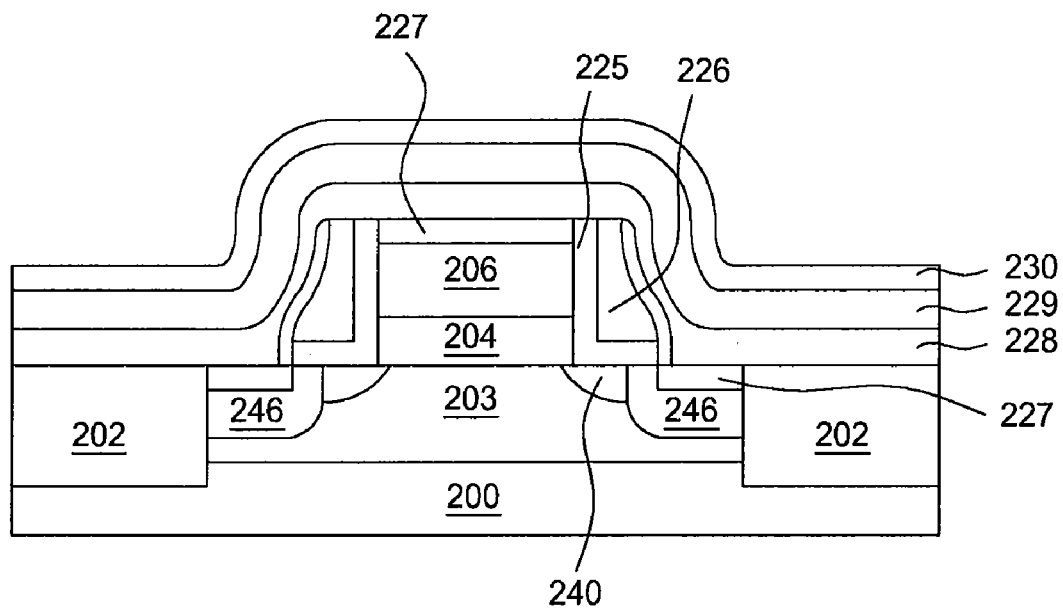

Next, as shown in FIG. 5D, a salicidation process is performed to form nickel silicide 227 on exposed silicon. A blanket nitride deposition is followed to deposit a nitride layer 228. The nitride deposition is generally performed by PECVD. A pre-metal dielectric (PMD) layer 229 is formed on the nitride layer 228. A PMD capping layer 230 is formed over the PMD layer 229.

Figure 7:
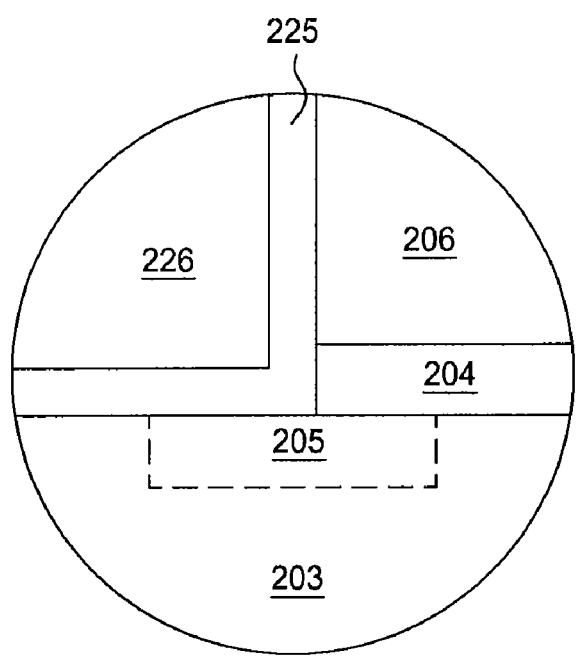
FIG. 7 schematically illustrates an enlarged sectional view of portion of a gate structure susceptible to channel oxidation.

FIG. 7 is a partial enlarged view of FIG. 5D showing a region in a transistor that is venerable to channel oxidation. The dash line circle region 205 in the well 203 is susceptible to oxidation during subsequent processing that requires high temperature because oxidizing agents in the nearby area, such as in the gate dielectric 204, which typically comprises oxides, e.g. amorphous silicate oxides and in the thin oxide layer 225, are likely to diffusion in the well 203, causing channel oxidation in area 205. The present invention replaces conventional high temperature oxidation with low temperature oxidation during spacer oxide formation, thus effectively reduce channel oxidation in a transistor.

Spacer Oxide for Metal Gate Stack

Figure 6A:
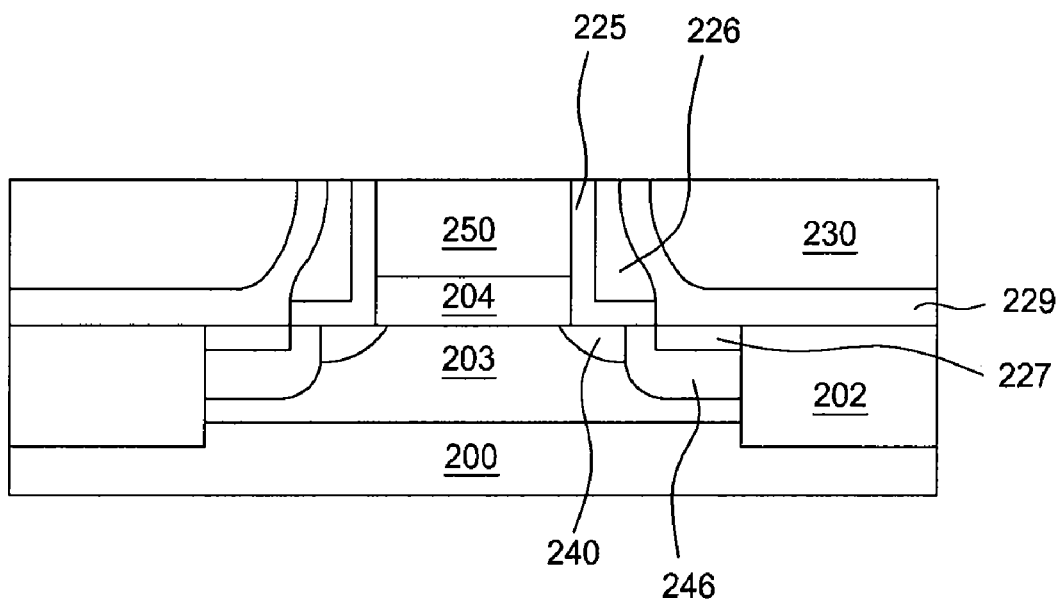
FIGS. 6A-6B schematically illustrate formation of a gate structure having a low temperature spacer oxide in accordance with another embodiment of the present invention.
Figure 6B:
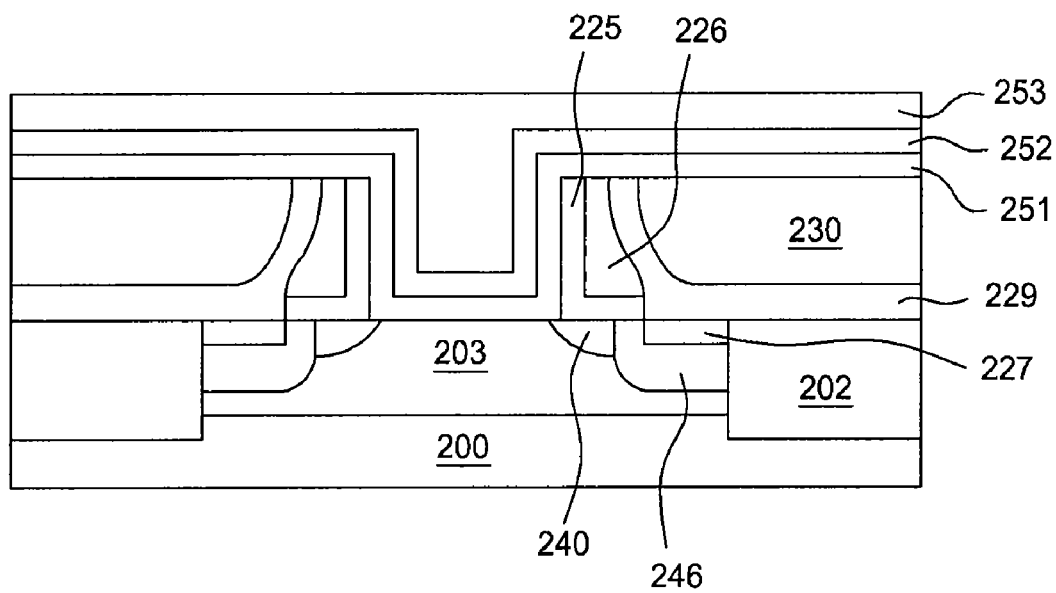

FIGS. 6A-6B schematically illustrate formation of a metal gate structure having a low temperature spacer oxide in accordance with another embodiment of the present invention.

The formation of a metal gate structure is similar to formation of the gate structure shown in FIGS. 5A-5C, except a filling material 250 is in place of poly crystalline silicon gate electrode 206. The low temperature spacer oxide 226 is used in the same manner and provides the same benefit of reducing channel oxidation in the well 203.

As shown in FIG. 6A, after the spacer layer 226 and thin oxide layer 225 are etched to remove the spacer layer 226 and thin oxide layer 225 from the top of the gate electrode 206 as well as from the top surface of the isolation regions 202 and from most of the top surface of the substrate 200 except immediately to either side of the gate stack 224, the substrate 200 is subjected to a deep, high dose source/drain (HDD) implant process to form deep junction source/drain regions 246 in the well region 203. A salicidation process is performed to form nickel silicide 227 on exposed silicon. A blanket nitride deposition is followed to deposit a nitride layer 228. The nitride deposition is generally performed by PECVD. A pre-metal dielectric (PMD) layer 229 is formed on the nitride layer 228. A PMD capping layer 230 is formed over the PMD layer 229.

A polishing process is then performed to expose the filing material 250, as shown in FIG. 6B. The filing material 250 is then removed, probably by etching forming a trench having the thin oxide layer 225 as sidewalls and the gate dielectric 204 as bottom. A metallic barrier layer 251 is deposited over the thin oxide layer 225 and the gate dielectric 204. Gate metal 252 is then deposited on over the metallic barrier layer 251. A liner 253 can be used to fill the remaining space in the gate structure. A CMP process may generally follow the gate metal deposition and prepare the metal gate structure for future fabrication steps.

Conformal Oxide Film Used in Flash Memory Cells

In low temperature conformal oxide film may be used in formation of flash memory cells. As shown in FIGS. 8 and 9A-9C.

Figure 8:
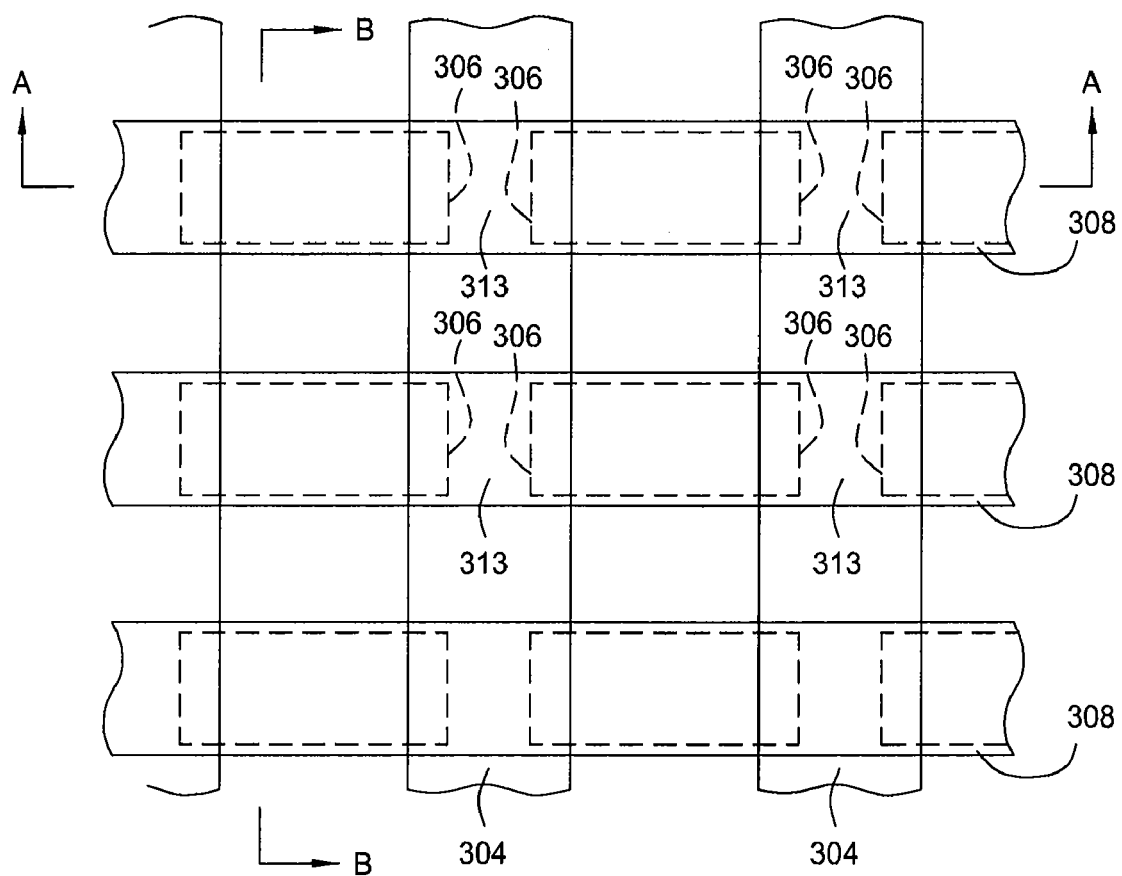
FIG. 8 schematically illustrates a partial top view of flash memory cells having low temperature oxide in accordance with one embodiment of the present invention.
Figure 9A:
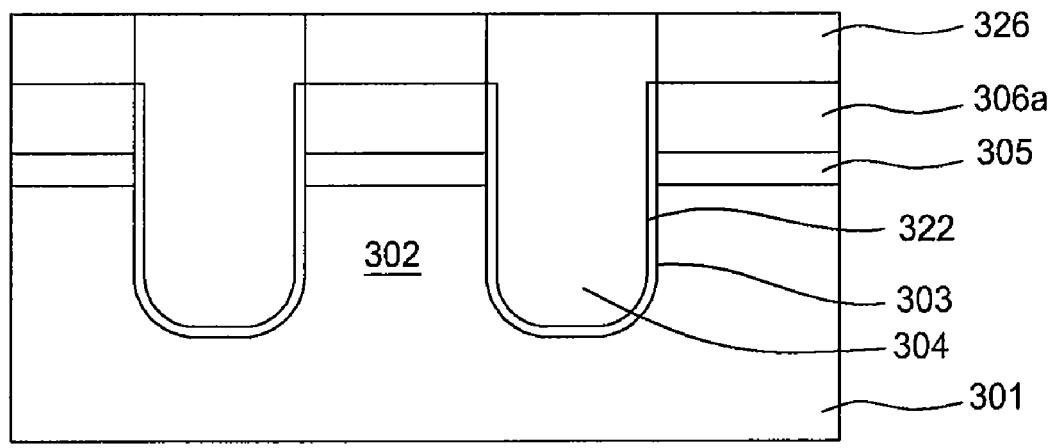
FIGS. 9A-9C are sectional side views of the flash memory cells of FIG. 8, showing the formation of the flash memory cells.
Figure 9A:
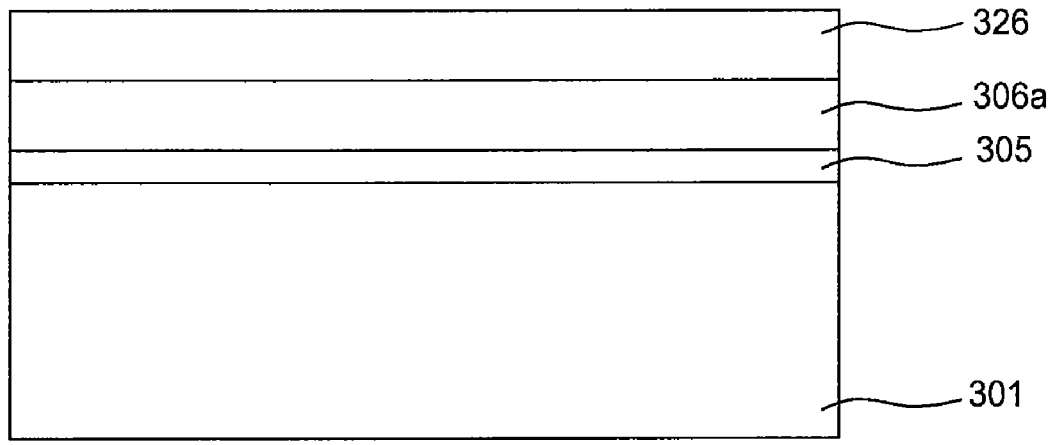
Figure 9B:
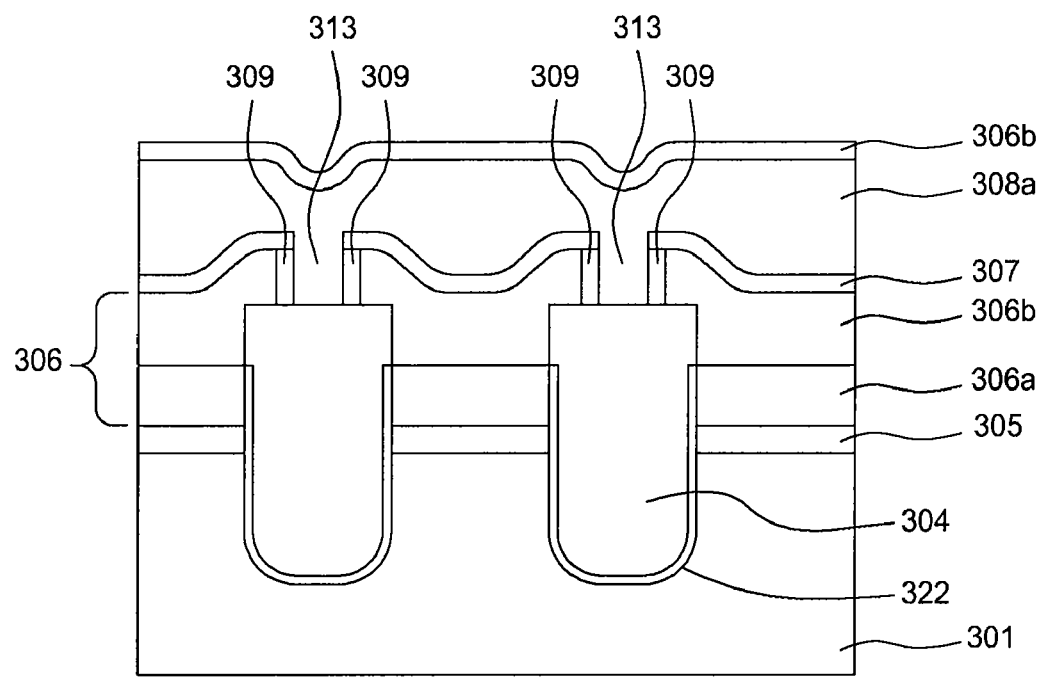
Figure 9B:
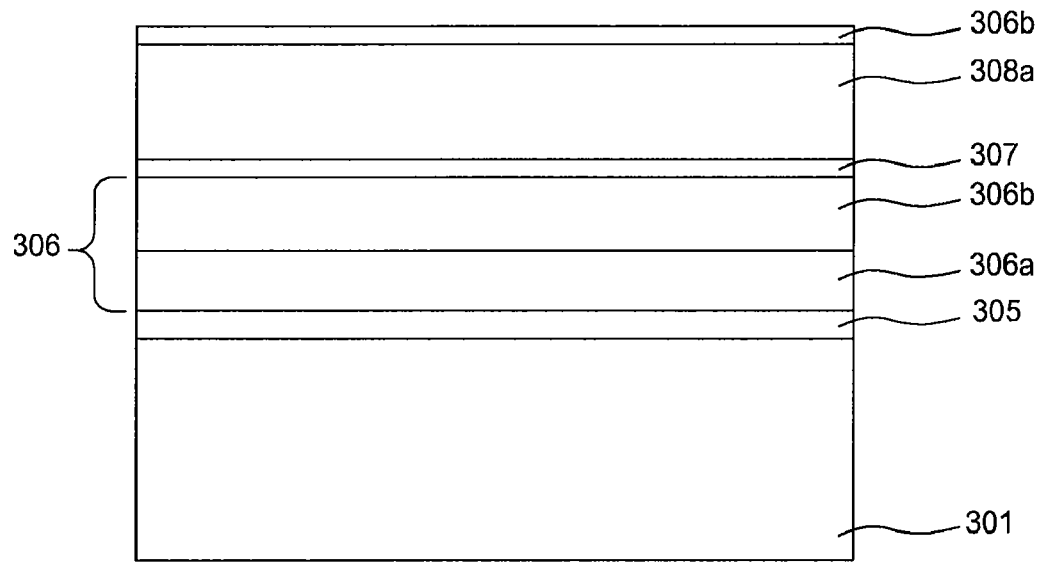
Figure 9C:
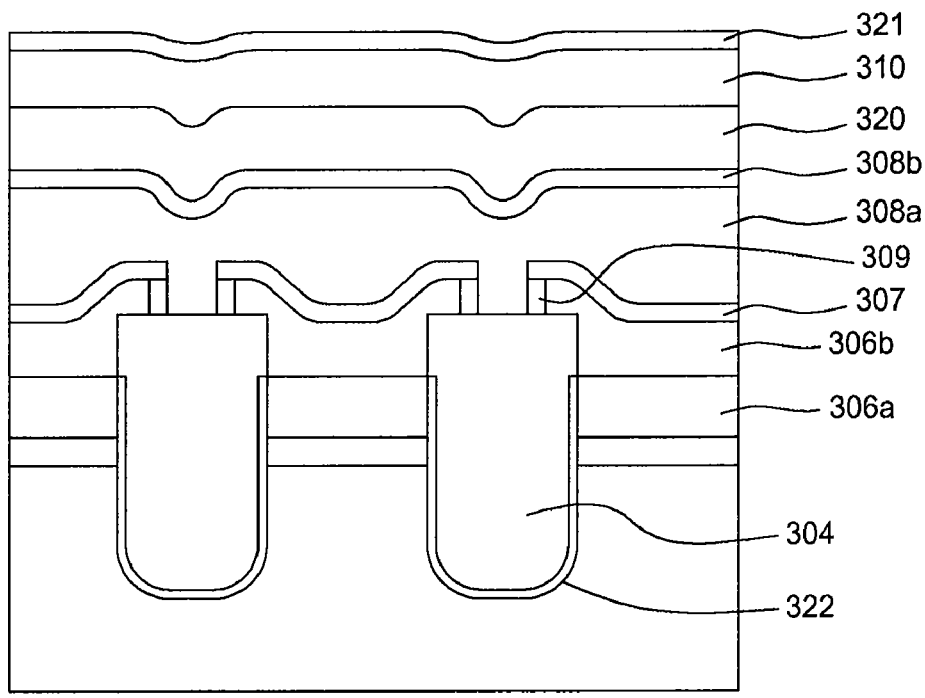
Figure 9C:
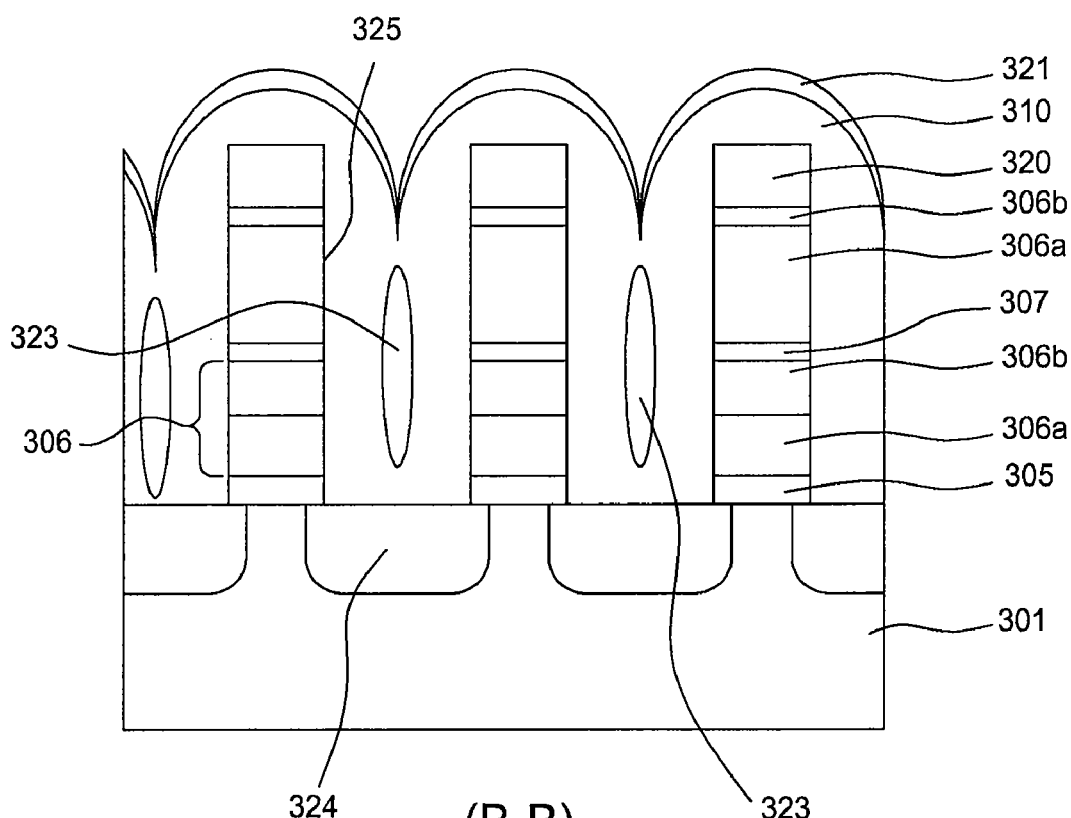

FIG. 8 schematically illustrates a partial top view of flash memory cells having low temperature oxide in accordance with one embodiment of the present invention. FIGS. 9A-9C are sectional side views taken along the A-A line and B-B line of the flash memory cells of FIG. 8, showing the formation of the flash memory cells.

The memory cell array is formed on a p-type well of a silicon substrate 301. A first gate insulating film 305 is formed on the silicon substrate 301. A first polycrystalline silicon (or amorphous silicon) film 306a is formed on the first gate insulating films 305. Device isolation channels 303 are formed in the substrate stack as tunneling insulation films in element-forming regions 302 via a mask layer 326. A channel insulating film 322 may be formed in the device isolation channels 303. In one embodiment, the channel insulating film 322 may be formed using low temperature cyclic method shown FIG. 1A or FIG. 1B. The device isolation channels 303 are then buried with device isolation films 304 to define stripe-shaped element-forming regions 302, as shown in FIG. 9A.

Referring to FIG. 9B, a second polycrystalline silicon (or amorphous silicon) film 306b is formed deformation of the device isolation films 304 and the removal of the mask layer 326. The first polycrystalline silicon (or amorphous silicon) film 306a and the second polycrystalline silicon (or amorphous silicon) film 306b will form floating gates 306.

Formed on the floating gates 306 are control gates 308 via second gate insulating films 307. The second gate insulating films 307 between the floating gates 306 and the control gates 308 are ONO films, which are multi-layered film of a silicon oxide film (O), on a silicon nitride film (N) on a silicon oxide film (O). The second gate insulating films 307 are divided by slits 313 on element isolation films 304 to lie merely on the floating gates 306 along word line directions. Therefore, on side surfaces of the floating gates 306, floating gate insulating films 309 are formed to isolate floating gates 306 from the control gates 308. In one embodiment, the floating gate insulating films 309 may be formed using low temperature cyclic method shown FIG. 1A or FIG. 1B.

The control gates 308 comprises a two-layered structure of polycrystalline silicon (or amorphous silicon) films 308a and tungsten silicide (WSi) films 308b, as shown in FIG. 9B. The control gates 308 are then patterned using a hard mask 320 to form trenches 325 that continuously extend over a plurality of element-forming regions 302, as shown in FIG. 9C.

Source/drain regions 324 are created by ion implanting for each memory cell. Gate sidewall spacer 310 is then deposited in the trenches 325 for insulation. In one embodiment, the gate sidewall spacer 310 may be silicon oxide formed using low temperature cyclic method shown FIG. 1A or FIG. 1B. The low temperature cyclic method may be easily adjusted to form air gaps 323 in the trenches to reduce dielectric value of the gate sidewall spacer 310. A capping layer 321 may be formed over the gate sidewall spacer 310.

Using the low temperature cyclic method of the present invention to form the gate sidewall spacer 310 in memory cells has several advantages. First, the low temperature oxide is high quality dielectric which replaces thermal oxide films at low cost of owner ship, thus, enabling continued scaling in memory cell products. Second, the low temperature cyclic method makes it possible to generate controllable voids in the gate sidewall spacers 310, thus, reducing capacitance and cross talk in the memory cells. Third, the low temperature oxide has excellent breakdown, leakage properties that desirable by the memory cells. Fourth, low temperature during process ensures minimal oxidation in poly crystalline silicon in floating gates and control gates, silicon in the substrate, and tungsten in the control gates, and other materials.

While the foregoing is directed to embodiments of the present invention, other and further embodiments of the invention may be devised without departing from the basic scope thereof, and the scope thereof is determined by the claims that follow.

What is claimed is:

1. A method for forming a semiconductor gate structure, comprising:
   forming a gate stack on a semiconductor substrate;
   forming a conformal silicon oxide layer on the semiconductor substrate using a low temperature cyclic method, the low temperature cyclic method comprises:
      exposing the semiconductor substrate to a silicon containing precursor to form a seed layer, wherein the seed layer comprises Si—$CH_3$ bonds, and the presence of Si—$CH_3$ bonds substantially hinders further deposition of the seed layer;
      treating the seed layer with a plasma of an oxygen containing gas to generate silicon oxide; and
      cyclically repeating the exposing and treating; and
   forming a spacer layer on the conformal silicon oxide layer.

2. The method of claim 1, wherein the low temperature cyclic method is performed at a temperature between 200° C. and 400° C., and the silicon containing precursor comprises octamethylcyclotetrasiloxane (OMCTS).

3. The method of claim 1, wherein the exposing the semiconductor substrate to a silicon containing precursor is performed simultaneously with presence of plasma.

4. The method of claim 3, wherein the treating the seed layer comprises removing methyl groups from the seed layer.

5. The method of claim 1, wherein the low temperature cyclic method further comprises purging silicon containing precursor prior to treating the seed layer, and the cyclically repeating comprises repeating the exposing, purging, and treating.

6. The method of claim 1, wherein the silicon containing precursor comprises octamethylcyclotetrasiloxane (OMCTS), methyldiethoxysilane (MDEOS), bis(tertiary-butylamino)silane (BTBAS), trisdimethylaminosilane (TrisDMAS), or combinations thereof.

7. The method of claim 6, wherein the silicon containing precursor comprises octamethylcyclotetrasiloxane (OMCTS) and the oxygen containing gas comprises oxygen.

8. The method of claim 1, wherein the gate stack comprises a layer of gate dielectric deposited on the semiconductor substrate, and a layer of poly crystalline silicon deposited on the gate dielectric.

9. The method of claim 1, wherein the gate stack comprises a layer of gate dielectric deposited on the semiconductor substrate and a layer of filler material deposited on the layer of gate dielectric, and the layer of filler material is to be replaced by gate metal in subsequent processing steps.

10. A method for forming a memory cell, comprising:
   forming a memory gate stack comprising a floating gate and a control gate on a semiconductor substrate; and
   forming a gate sidewall spacer on the semiconductor substrate using a low temperature cyclic method, wherein the low temperature cyclic method comprises:
      exposing the semiconductor substrate to a silicon containing precursor to form a seed layer, wherein the seed layer comprises Si—$CH_3$ bonds and the presence of Si—$CH_3$ bonds substantially hinders further deposition of the seed layer;
      treating the seed layer with a plasma of an oxygen containing gas to generate silicon oxide; and
      cyclically repeating the exposing and treating.

11. The method of claim 10, wherein the exposing the semiconductor substrate to a silicon containing precursor is performed simultaneously with presence of plasma.

12. The method of claim 11, wherein treating the seed layer comprises removing methyl groups from the seed layer.

13. The method of claim 10, wherein the low temperature cyclic method further comprises purging silicon containing precursor prior to treating the seed layer, and the cyclically repeating comprises repeating the exposing, purging, and treating.

14. The method of claim 10, wherein the silicon containing precursor comprises octamethylcyclotetrasiloxane (OMCTS), methyldiethoxysilane (MDEOS), bis(tertiary-butylamino)silane (BTBAS), trisdimethylaminosilane (TrisDMAS), or combinations thereof.

15. The method of claim 10, wherein the forming the gate sidewall spacer comprises generating controllable voids in the gate sidewall spacer.

16. The method of claim 10, wherein the forming the memory gate stack comprising:
   depositing a first insulating film on the semiconductor substrate;
   forming device isolation channels in the first insulating film and the semiconductor substrate;
   depositing a channel insulating film in the device isolation channels;
   filling the device isolation channels with device isolation film;
   forming floating gate layers on the semiconductor substrate;
   depositing a second insulating film and forming a pattern on the second insulating film and the floating gate layers;
   forming a floating gate insulating film on exposed floating gate layer;
   depositing control gate layers; and
   patterning the semiconductor substrate to form the memory gate stack.

17. The method of claim 16, wherein the depositing the channel insulating film comprises depositing a silicon oxide film using a low temperature cyclic method, the low temperature cyclic method comprises:
   exposing the semiconductor substrate to a silicon containing precursor to form a seed layer, wherein the seed layer comprises Si—$CH_3$ bonds and the presence of Si—$CH_3$ bonds substantially hinders further deposition of the seed layer;
   treating the seed layer with a plasma of an oxygen containing gas to generate silicon oxide; and
   cyclically repeating the exposing and treating.

18. The method of claim 17, wherein forming the floating gate insulating film comprises depositing a silicon oxide film using a low temperature cyclic method.

19. The method of claim 10, wherein the low temperature cyclic method is performed at a temperature between 200° C. and 400° C., and the silicon containing precursor comprises octamethylcyclotetrasiloxane (OMCTS).

* * * * *

UNITED STATES PATENT AND TRADEMARK OFFICE
CERTIFICATE OF CORRECTION

PATENT NO.       : 7,851,385 B2
APPLICATION NO.  : 12/241826
DATED            : December 14, 2010
INVENTOR(S)      : Spuller et al.

It is certified that error appears in the above-identified patent and that said Letters Patent is hereby corrected as shown below:

Column 7, Line 37, please delete "ferroelectics" and insert --ferroelectrics-- therefor.

Signed and Sealed this
Eighth Day of March, 2011

David J. Kappos
*Director of the United States Patent and Trademark Office*